United States Patent [19]
Murata

[11] Patent Number: 5,138,258
[45] Date of Patent: Aug. 11, 1992

[54] HALL EFFECT DEVICE FOR CRANK ANGLE SENSING IN WHICH THE HALL EFFECT DEVICE IS SEALED IN A FRAME USING SILICONE GEL AND RESIN

[75] Inventor: Shigemi Murata, Himeji, Japan
[73] Assignee: Mitsubishi Denki K.K., Tokyo, Japan
[21] Appl. No.: 476,841
[22] Filed: Feb. 8, 1990
[30] Foreign Application Priority Data
  Feb. 21, 1989 [JP] Japan .................. 1-39454
[51] Int. Cl.$^5$ .................. G01B 7/14; G01N 27/72; G01R 33/12; F02P 7/00
[52] U.S. Cl. .................. 324/207.2; 324/235; 324/251; 338/32 H; 123/617
[58] Field of Search .......... 324/207.2, 235, 251; 338/32 H; 307/309; 123/146.5 A, 617; 29/602 R

[56] References Cited

U.S. PATENT DOCUMENTS

| | | | |
|---|---|---|---|
| 4,235,213 | 11/1980 | Jellisson | 123/617 |
| 4,359,978 | 11/1982 | Brammer et al. | 123/617 |
| 4,369,376 | 1/1983 | Ertl et al. | 338/32 H |
| 4,919,106 | 4/1990 | Kodama et al. | 123/617 |

FOREIGN PATENT DOCUMENTS 3521966  1/1987  Fed. Rep. of Germany .

OTHER PUBLICATIONS

"Function and Applicability of the Hall-Magnet-Fork-Gate HKZ 101", Lachmann, Ulrich (1982).

*Primary Examiner*—Walter E. Snow
*Attorney, Agent, or Firm*—Sughrue, Mion, Zinn, Macpeak & Seas

[57] ABSTRACT

A Hall effect type sensing device comprises a magnetic circuit, a Hall transducing element arranged in the magnetic circuit to output a signal depending on a change in magnetic flux, a magnetic flux changing member which is able to change the magnetic flux in the magnetic circuit, a gap part which allows the magnetic flux changing member to move therein, and a frame member having its one side provided with a recessed portion forming the gap portion, and having its other side provided with an accommodation portion at a position adjacent to the recessed portion, the accommodation portion housing the Hall transducing element and a member forming the magnetic circuit.

3 Claims, 2 Drawing Sheets

HALL EFFECT DEVICE FOR CRANK ANGLE SENSING IN WHICH THE HALL EFFECT DEVICE IS SEALED IN A FRAME USING SILICONE GEL AND RESIN

BACKGROUND OF THE INVENTION

1. Field of the Invention

The present invention relates to a Hall effect type sensing device which can be preferably used to detect e.g. a crank angle in an ignition timing control apparatus for internal combustion engines.

2. Discussion of Background

There have been widely known various types of sensors utilizing Hall effect devices, such as a position sensor, an angle sensor and a speed sensor. A Hall IC formed by integrating or packaging a Hall transducing element used for such sensing devices has been also known. In addition, there has been known a Hall effect type sensing device for controlling ignition timing in internal combustion engines, wherein the Hall IC and a magnetic circuit are integrally assembled by a resin material.

In order to assemble such a conventional Hall effect type sensing device, the positions of components such as a Hall IC and magnetic circuit parts are located by using jigs for the respective components, a thermosetting resin is injected onto the components thus located, and the resin is cured in a heating furnace. Determining the positions of the components required various kinds of jigs, and positioning accuracy is poor. As a result, the structure of the conventional Hall effect type sensing device creates problems in that it is not suitable for a large scale production, and that it outputs poor accuracy of signals.

SUMMARY OF THE INVENTION

It is an object of the present invention to eliminate the problems of the conventional Hall effect type sensing device, and to provide a new and improved Hall effect type sensing device capable of easily determining the positions of the components, outputting high accuracy of signals, and facilitating assemblage in an automated production line.

The foregoing and other objects of the present invention have been attained by providing a Hall effect type sensing device comprising a magnetic circuit, a Hall transducing element arranged in the magnetic circuit to output a signal depending on a change in magnetic flux, a magnetic flux changing member which is able to change the magnetic flux in the magnetic circuit, a gap part which allows the magnetic flux changing member to move therein, and a frame member having its one side provided with a recessed portion forming the gap portion, and having its other side provided with an accommodation portion at a position adjacent to the recessed portion, the accommodation portion housing the Hall transducing element and a member forming the magnetic circuit.

The provision of the accommodation portion of the frame member according to the present invention facilitates positioning of the magnetic circuit forming member and the Hall transducing element, and allows these parts to be housed from one direction, making the assemblage of the sensing device easy.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
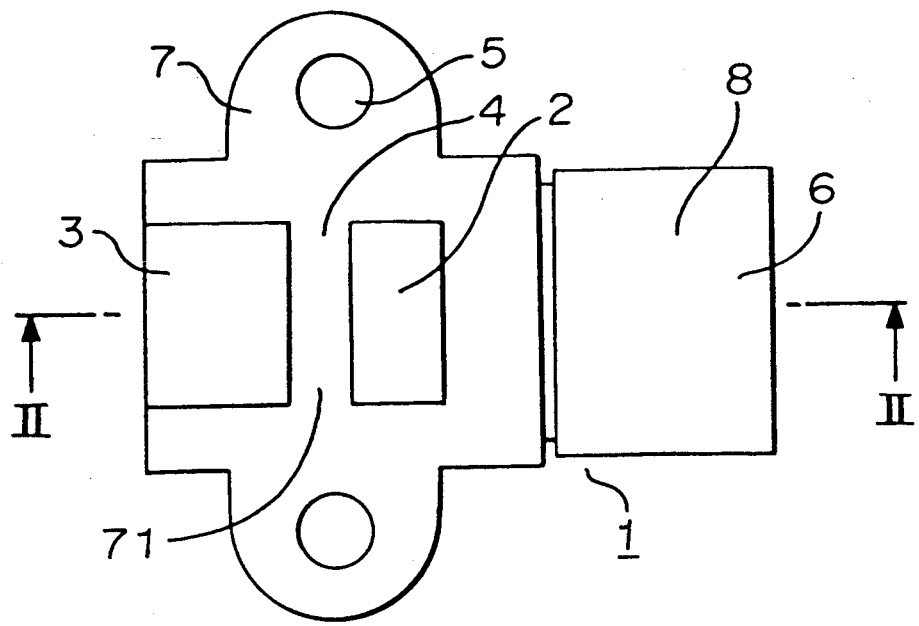
FIG. 1 is a plan view of an embodiment of the Hall effect type sensing device according to the present invention.
Figure 2:
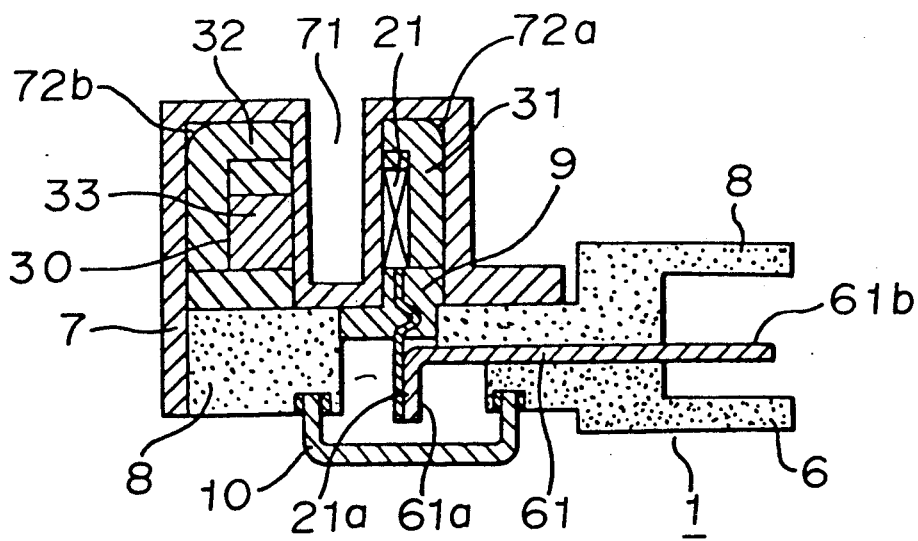
FIG. 2 is a cross sectional view taken on line II—II of FIG. 1.

The sensing device of the embodiment shown in FIGS. 1 and 2 is constructed to have a shape suited for detecting a crank angle of an internal combustion engine.

As shown in FIGS. 1 and 2, the Hall effect type sensing device 1 includes a detecting part 2, a magnet part 3, a gap part 4, a mounting part 5 and a connector part 6. The parts 2 through 5 are formed by a frame member 7 which is produced by injection molding of a synthetic resin material. The frame member 7 has one side (its upper surface in FIG. 2) provided with a recessed portion 71 forming the gap part 4, and has the other side (its lower surface in FIG. 2) provided with accommodation portions 72a and 72b which are arranged adjacent to and at the opposite ends of the recessed portion 71. A Hall IC 21, and a first magnetic flex guide 31 forming a part of a magnetic circuit forming member 30 are housed and located in one of the accommodation portions 72a and 72b. A second magnetic flux guide 32 and a magnet 33 forming the other part of the magnetic circuit forming member 30 are housed and located in the other accommodation portion. The magnet 33 is bonded to the second magnetic guide 32 by adhesive before it is housed in the accommodation portion. To one end of the frame member 7 is fixed a frame 8 with the connector part 6 by means of e.g. bonding. The frame 8 is also made of injection-molded synthetic resin, and has inserted conductors 61 integrally embedded. The inserted conductors 61 have their connecting portions 61a electrically connected to lead wires 21a of the Hall IC 21 by e.g. spot welding. The inserted conductors have their outer ends provided with connecting pieces 61b for the connector part 6. The presence of a sealing member 9 made of silicone gel material protects the Hall IC 21 from dirt and dust, a corrosive gas and heat. A cover 10 is fixed to the frame 8 by adhesive to cut off the connecting portions 61a from external air.

As stated earlier, the frame member 7 has the one side provided with the recessed portion 71 forming the gap part 4, and has the other side provided with the accommodation portions 72a and 72b for housing the Hall IC 21 and the magnetic circuit forming member 30. As a result, it is not necessary to use jigs for locating the components of the sensing device, allowing positioning accuracy to be easily increased. In assembling the sensing device, from the beginning of assemblage, the frame member 7 is held in such manner that it is turned upside down in respect to the state shown in FIG. 2. Inserting the magnetic circuit forming member 30 and the Hall IC 21 into the accommodation portions 72a and 72b of the reversed frame member 7, assembling the frame 8 to the frame member 7, spot-welding to the connecting portions 61a, injecting the sealing member 9, and mounting the cover 10 can be carried out in turn from one direction. This allows the assemblage to be easily automated, the inversion of the frame member during the assemblage to be eliminated, the assemblage to be simplified, and manufacturing time to be shortened. In addition, the components of the device is good at corrosion and so on because the components are not exposed after assemblage. The rigidity of the components is improved to increase strength. Further, positioning accuracy is increased to offer a sensing device having high accuracy.

The sensing device having the structure described above can be constituted so that a magnetic flux changing member (not shown), e.g. a shutter part of a magnetic flux shutter having a cylindrical shape or a disklike shape, which can change the magnetic flux in the magnetic circuit moves in the gap part 4. When the magnetic flux shutter is rotated, the change in the magnetic flux which depends on the rotation of the magnetic flux shutter is given to the Hall IC 21. The Hall IC 21 outputs an electric signal which depends on the rotation of the magnetic flux shutter based on the well known Hall effect. The electric signal is taken out to outside through the connector 6, and is subjected to processing such as waveform shaping by a processing circuit not shown. When the Hall effect type sensing device 1 is utilized in e.g. an ignition timing control apparatus for an internal combustion engine, the sensing device 1 is housed in e.g. the housing of a distributor (the distributor and its housing are not shown for the sake of clarity). The magnetic flux shutter can be rotated in synchronism with the operation of the engine to detect e.g. a crank angle, thereby controlling the ignition timing based on the detected crank angle.

Figure 3:
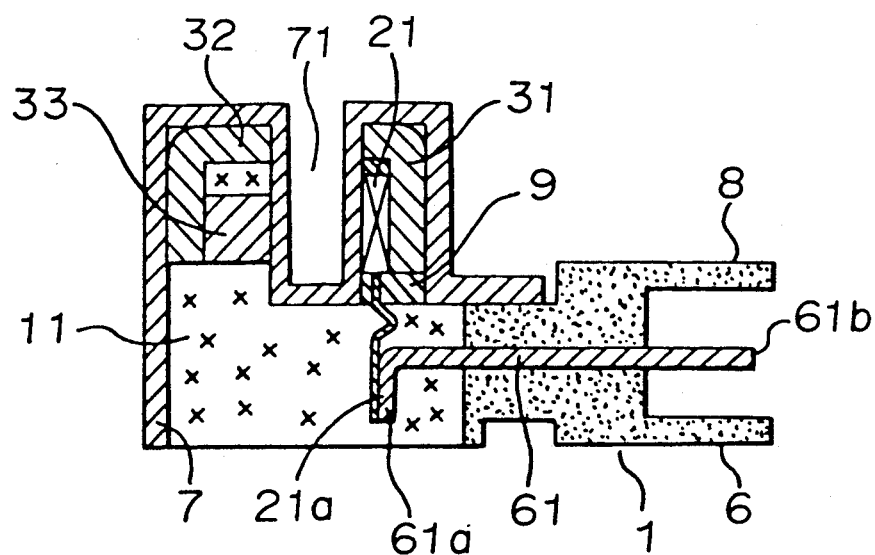
FIG. 3 is a cross sectional view of another embodiment of the Hall effect type sensing device of the present invention.

FIG. 3 is a cross sectional view similar to FIG. 2 depicting another embodiment of the present invention. In the second embodiment, the shape of the frame 8 is partially modified, and a sealing member 11 made of a hard type epoxy resin adhesive is filled in the space which surrounds the bonding portion between the lead wires 21a of the Hall IC and the connecting portions 61a of the inserted conductors. The sensing device according to the second embodiment can eliminate the cover 10, and enclose the bonding portion of the lead wires by the sealing member 11, allowing the number of the components to be decreased, and the assemblage to be simplified.

Although in the first and second embodiments, the Hall IC 21 and the magnetic flux guide 31 are housed in the first accommodation portion, 72a and the magnetic flux guide 32 and the magnet 33 are housed in the second accommodation portion 72b, the present invention is not limited to such structure. It is safe for the sensing device of both embodiments to be modified, e.g. the way that the Hall IC 21 and the magnet 33 are interchanged, or the magnet 33 and the Hall IC 21 are housed in the first accommodation portion 72a. In addition, the frame member 7 can be made of non-magnetic material such as copper, aluminium, alloy containing copper and aluminium, or stainless steel. Further, required or desired modification can be made to the embodiments. For example, the frame member 7 and the frame 8 can be integrally formed from resin material, the sealing material 9 and the sealing material 11 in the second embodiment of FIG. 3 can be integrally formed, or a plurality of detection units comprising the detecting part 2 and the magnetic part 3 can be arranged.

Although the explanation on the first and second embodiments has been made in reference to the case wherein the sensing device according to the present invention is utilized to detect a crank angle in the ignition timing control apparatus, the sensing device is applicable to other applications. For example, the magnetic flux shutter can be linearly moved, or the sensing device can be used as a positioning sensor or a speed sensor.

Obviously, numerous modifications and variations of the present invention are possible in light of the above teachings. It is therefore to be understood that within the scope of the appended claims, the invention may be practiced otherwise than as specifically described herein.

What is claimed is:

1. A crank angle sensor for an internal combustion engine, comprising:
    a) a frame member configured to define two horizontally spaced, upstanding generally rectangular housing cavities (72a, 72b) closed on both upper ends and on all four sides thereof, and disposed on opposite sides of an open slot (71) defined therebetween, a bottom of said slot also being closed by the frame member, and said slot constituting an air gap adapted to accommodate a moving magnetic flux changing member,
    b) first and second magnetic flux guides (31, 32) individually disposed in the cavities, and defining a magnetic circuit extending across the slot,
    c) a permanent magnet (33) disposed in one of the cavities in operative cooperation with one of the first and second flux guides,
    d) a Hall effect transducer (21) disposed in one of the cavities in operative cooperation with one of the first and second flux guides,
    e) an electrical connector member (61) operatively coupled to conductor leads of the transducer below the cavity wherein the transducer is disposed, and
    f) a closure member (8,9,10; 9,11) underlying the frame member and sealing otherwise open bottoms of the cavities to isolate in cooperation with the frame member, the flux guides, magnet, transducer and connector member from the external environment and to prevent contamination thereby, said closure member comprising a sealing member (9) comprising silicone gel for sealing the bottom of the cavity in which said transducer is disposed to protect said transducer from contaminants, corrosive gasses, and heat, the closure member further comprising a resin material (8;11),
    g) wherein the configurations of the cavities serve to accurately position the flux guides, magnet and transducer during an automated assembly of the sensor, and wherein said configurations of said cavities house said magnetic circuit and said Hall effect transducer from one direction during said assembly of said sensor.

2. A crank angle sensor according to claim 1 wherein the magnet and transducer are disposed in different cavities.

3. A crank angle sensor according to claim 1 wherein the closure member further comprises a cover member (10) fixed to the resin material and enclosing the connector member.

* * * * *